United States Patent
Helle et al.

(10) Patent No.: US 7,952,346 B2
(45) Date of Patent: *May 31, 2011

(54) METHOD FOR ESTIMATING THE MAGNETIZATION LEVEL OF ONE OR MORE PERMANENT MAGNETS ESTABLISHED IN ONE OR MORE PERMANENT MAGNET ROTORS OF A WIND TURBINE GENERATOR AND WIND TURBINE

(75) Inventors: Lars Helle, Suldrup (DK); Morten Lindholm, Hojbjerg (DK); Flemming Buus Bendixen, Hobro (DK)

(73) Assignee: Vestas Wind Systems A/S (DK)

( * ) Notice: Subject to any disclaimer, the term of this patent is extended or adjusted under 35 U.S.C. 154(b) by 0 days.

This patent is subject to a terminal disclaimer.

(21) Appl. No.: 12/565,551

(22) Filed: Sep. 23, 2009

(65) Prior Publication Data

US 2010/0033166 A1 Feb. 11, 2010

Related U.S. Application Data

(63) Continuation of application No. PCT/DK2008/000113, filed on Mar. 19, 2008.

(30) Foreign Application Priority Data

Mar. 23, 2007 (DK) ................................ 2007 00452

(51) Int. Cl.
*G01B 7/30* (2006.01)
*G01R 33/12* (2006.01)

(52) U.S. Cl. ..................... 324/207.25; 324/378; 324/205

(58) Field of Classification Search .......... 324/173–174, 324/207.25, 378, 205; 73/514.31, 514.39
See application file for complete search history.

(56) References Cited

U.S. PATENT DOCUMENTS

| 5,650,706 A | 7/1997 | Yamada et al. |
|---|---|---|
| 2002/0149275 A1 | 10/2002 | Gauthier et al. |
| 2003/0055584 A1 | 3/2003 | Raftari et al. |
| 2003/0071467 A1 | 4/2003 | Calley et al. |
| 2004/0041409 A1 | 3/2004 | Gabrys |
| 2005/0264110 A1 | 12/2005 | Humphries et al. |

FOREIGN PATENT DOCUMENTS

| DE | 3511921 A1 | 10/1986 |
|---|---|---|
| DK | 172430 B1 | 6/1998 |
| FR | 2851092 A1 | 8/2004 |
| JP | 2004173415 A | 6/2004 |

OTHER PUBLICATIONS

Danish Search Report; PA 2007 00452; Sep. 7, 2007; 1 page.
International Search Report; PCT/DK2008/000113; Jun. 9, 2008; 2 pages.

*Primary Examiner* — Bot L LeDynh
(74) *Attorney, Agent, or Firm* — St. Onge Steward Johnston & Reens LLC

(57) ABSTRACT

A method for estimating the magnetization level of one or more permanent magnets established in one or more permanent magnet rotors of a wind turbine generator includes the steps of: establishing one or more magnetization sensors at the stator of the generator, connecting the one or more magnetization sensors to a measuring mechanism, processing measured data in the measuring mechanism, and establishing values of magnetization. Furthermore the invention also relates to a wind turbine.

21 Claims, 4 Drawing Sheets

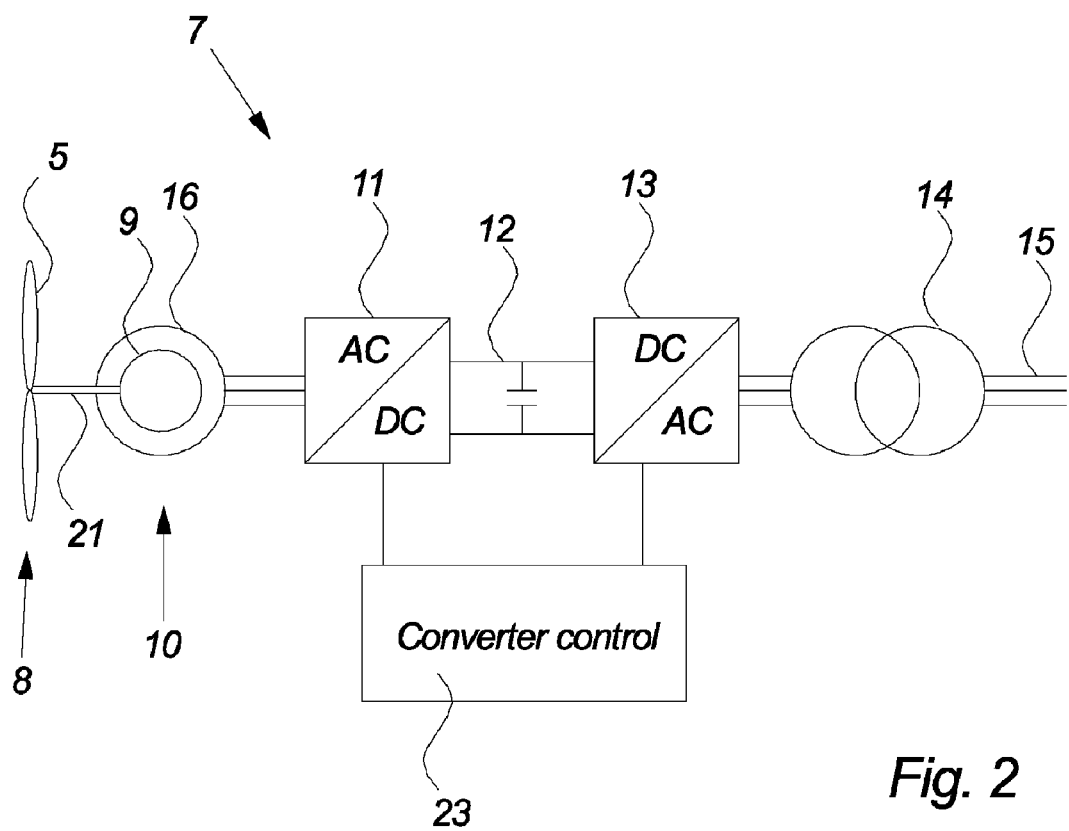
*Fig. 2*
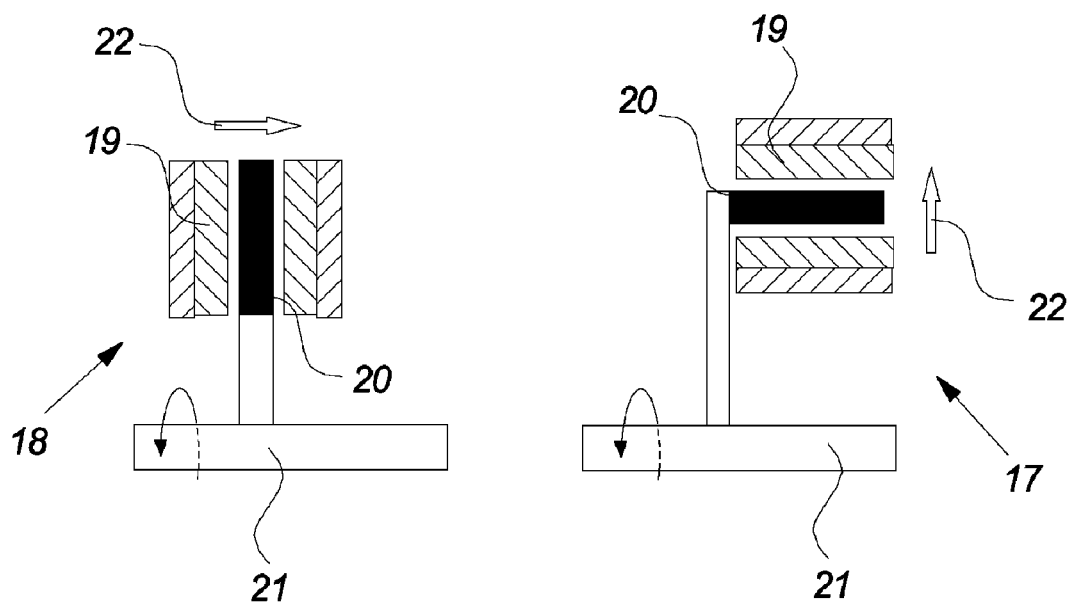
*Fig. 3a*          *Fig. 3b*

METHOD FOR ESTIMATING THE MAGNETIZATION LEVEL OF ONE OR MORE PERMANENT MAGNETS ESTABLISHED IN ONE OR MORE PERMANENT MAGNET ROTORS OF A WIND TURBINE GENERATOR AND WIND TURBINE

CROSS-REFERENCE TO RELATED APPLICATIONS

The present application is a continuation of pending International patent application PCT/DK2008/000113 filed on Mar. 19, 2008 which designates the United States and claims priority from Danish patent application PA 2007 00452 filed on Mar. 23, 2007, the content of which is incorporated herein by reference.

FIELD OF THE INVENTION

The present invention relates to a method for estimating the magnetization level of one or more permanent magnets established in one or more permanent magnet rotors of a wind turbine generator and a wind turbine.

BACKGROUND OF THE INVENTION

The operation of a PM wind turbine generator is highly dependent on the condition of the permanent magnets. Faults such as broken magnets or non-uniformly magnetization levels of the magnets give rise to a degraded quality and utilization of the generator.

It is well known to assemble an electrical PM machine with pre-magnetized magnets in prepared slots comprised in the rotor as disclosed in Danish patent DK 172430.

A disadvantage by the described method is that at the installation extensive magnetic forces act between the magnets and other magnetic components of the electrical machine. This requires special precautions to be taken during installation comprising special tools handling the magnets, magnetic components and the forces that interact.

Furthermore as the magnets are magnetized prior to installation, the condition of the magnets after installation is left uncertain until the wind turbine is operated.

US patent application US 2002/0149275 discloses an electrical machine comprising magnetic-field sensors mounted on the stator as to detect the angular position of the rotor.

It is an object of the invention to provide technique without the above mentioned disadvantages and especially it is an object to provide technique that enables monitoring the condition of the permanent magnets after they are installed in the rotor of a wind turbine generator.

SUMMARY OF THE INVENTION

The present invention relates to a method for estimating the magnetization level of one or more permanent magnets established in one or more permanent magnet rotors of a wind turbine generator comprising the steps of:
- establishing one or more magnetization sensors at the stator of the generator,
- connecting said one or more magnetization sensors to measuring means,
- processing measured data in said measuring means, and establishing values of magnetization.

By estimating the magnetization level of permanent magnets established in the rotors of a wind turbine generator it is ensured that the status of the permanent magnets can be monitored. Hereby is achieved that errors such as defect magnets, magnets with degraded magnetization level, broken magnets etc. can be monitored.

Furthermore generator service intervals can be evaluated and scheduled on basis of actual needs instead of e.g. fixed intervals. This in turn may result in an optimization of power production of the wind turbine.

Even further a fingerprint of initial magnetization levels of magnets can be obtained at the installation and the fingerprint can be used as reference for further monitoring purposes.

In another aspect of the invention said establishing one or more magnetization sensors is performed when the wind turbine generator is installed in a wind turbine nacelle.

In another aspect of the invention said establishing one or more magnetization sensors is performed before or after mounting the nacelle on a wind turbine tower.

In yet another aspect of the invention said connecting one or more magnetization sensors comprises connecting at least one stator coil of the generator. Hereby it is ensured that existing components of the wind turbine generator can be used in estimating the magnetization levels. Furthermore it is ensured that no explicit installation procedure of installing special sensors is necessary.

In another aspect of the invention said one or more magnetization sensors are replacing one or more stator parts of the wind turbine generator. Hereby it is ensured that special purpose and/or special developed sensors can be used in estimating the magnetization levels and/or said sensors may be optimized in relation to performance parameters such as sensitivity, resolution, operational speed etc.

In another aspect of the invention said values of magnetization are established substantially continuously or at predefined intervals during normal operation. Hereby it is ensured that the operation of the permanent magnets can be monitored on going and possible defect magnets or magnets whose magnetization level has decreased can be monitored. Furthermore said monitoring can be used in establishing trends for the magnets.

In another aspect of the invention, said measured values are obtained after termination of said magnetization procedure. The measured values established hereby represents one set of reference values or an initial fingerprint that can be used subsequently e.g. for further data-processing In a further aspect of the invention, said values of magnetization are established by measuring the magnetizing current supplied to said magnetizing coils. It is hereby ensured that values of the magnetization are established during the magnetization procedure, whereby a subsequent sensing procedure can be avoided and installation time can be saved.

In an even further aspect of the invention, said magnetizing coil further comprise one or more magnetization sensors. Hereby it is ensured that the magnetization sensor is an integrated part of the magnetizing coil.

In another aspect of the invention the method further comprises the step of evaluating said established values of magnetization by evaluating means. Hereby it is ensured that parameters of the wind turbine and especially parameters of the generator such as the magnetization level of the rotor permanent magnets can be data-processed e.g. in a computer. Said data-processing can in turn establish derived parameters such as measured levels over time, trends, predictions etc.

In yet another aspect of the invention said evaluating comprises comparing recent established values with previous stored established values. Hereby it is ensured that any deviation of the magnetization level in time can be monitored. Furthermore it is ensured that an automated system can be established where parameters such as trends can be established and monitored, and fluctuations in said parameters can be indicated.

In another aspect of the invention said evaluating comprises calculating trends of established valued and/or predicting future values. Hereby it is ensured that parameters such as time-to-next-service can be established and service inspections of the wind turbine can be scheduled.

In yet another aspect of the invention the method further comprises the step of controlling parameters of the wind turbine on the basis of said evaluation of established values. Hereby it is ensured that variations in e.g. the magnetization level of individual magnets can be compensated for e.g. to ensure enhanced power quality.

The invention also relates to a wind turbine comprising:
a wind turbine tower,
a wind turbine rotor,
a wind turbine nacelle comprising one or more wind turbine generators comprising one or more permanent magnets established in one or more permanent magnet rotors, and
means for estimating the magnetization level of said one or more permanent magnets.

In another aspect of the invention said wind turbine generator is an axial-flux generator, a radial-flux generator or a transversal-flux generator.

BRIEF DESCRIPTION OF THE DRAWINGS

The invention will be described in the following with reference to the figures in which FIG. 2 illustrates schematically the components of one embodiment of a direct driven synchronous wind turbine, FIG. 3a illustrates schematically the principle construction of an axial-flux generator, FIG. 3b illustrates schematically the principle construction of a radial-flux generator.

DETAILED DESCRIPTION OF THE INVENTION

Figure 1:
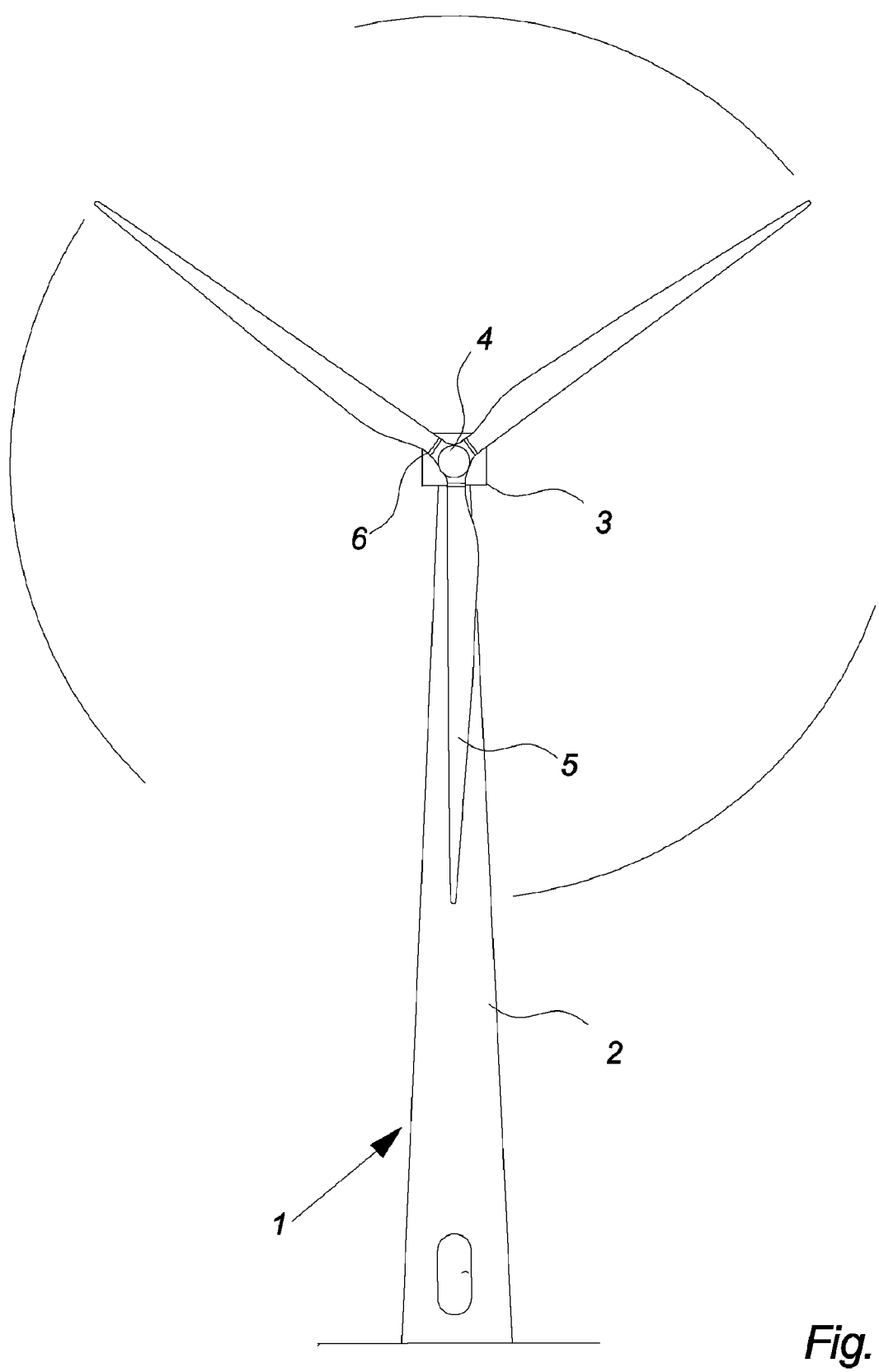
FIG. 1 illustrates a large modern wind turbine including three wind turbine blades in the wind turbine rotor.

FIG. 1 illustrates a modern wind turbine 1 with a tower 2 and a wind turbine nacelle 3 positioned on top of the tower.

The wind turbine rotor, comprising at least one blade such as three wind turbine blades 5 as illustrated, is connected to the hub 4 through pitch mechanisms 6. Each pitch mechanism includes a blade bearing and individual pitch actuating means which allows the blade to pitch. The pitch process is controlled by a pitch controller.

As indicated on the figure, wind over a certain level will activate the rotor and allow it to rotate in a substantially perpendicular direction to the wind. The rotation movement is converted to electric power by means comprising a generator and is usually supplied to the utility grid as will be known by skilled persons within the area.

In general the use of electrical generators in wind turbines comprises use of one of at least two basic types of generators i.e. generators based on electromagnetic or permanent magnets respectively. The present invention relates to a generator comprising permanent magnets (PM).

PM generators comprises two components i.e. a rotating magnetic field constructed using permanent magnets and a stationary armature constructed using electrical windings located in a slotted iron core.

In magnetized condition said permanent magnets have a North-seeking pole and a South-seeking pole respectively. Opposite pole types attract, while poles of the same type repel each other. Furthermore poles of either type attract iron, steel and a few other metals such as nickel and cobalt.

Permanent magnets are made out of ferro- (or ferri-) magnetic material such as NdFeB, SiFe, SrFeO or the like. During the formation of the magnetic material, very small atomic groups called magnetic domains act as one magnetic unit and produces a magnetic moment. The same domains align themselves in the same direction over a small volume. In non-magnetized condition the plurality domains of said permanent magnet are organized in a non-aligned way whereby the in a larger scale are substantially cancelling out each other resulting in no or a weak overall magnetic field.

By magnetizing a ferromagnetic permanent magnet e.g. by placing it in an external magnetic field such as produced in a solenoid with a direct current passing through it, all domains tend to align with the external magnetic field. Some domains align more easily than others so the resulting magnetic moment depends how strong the applied magnetic fields is, increasing until all possible domains are aligned.

If a ferromagnetic material is exposed for temperatures above its specific Curie temperature it loses its characteristic magnetic ability as thermal fluctuations destroy the alignment of said domains.

Usually permanent magnets are substantially not magnetic when they are produced but must be magnetized later on, e.g. on the location of production, just before they are assembled or after they as components are built into e.g. generators.

Sensing of the level of magnetization of a PM material in general comprises moving or establishing a conductor in a magnetic field, whereby a current is generated in the magnetization sensor, said current being proportional to the magnetic field.

FIG. 2 illustrates schematically the components of one embodiment of the present invention a direct driven pitch controlled variable speed synchronous generator wind turbine 7 comprising a wind turbine rotor 8 comprising wind turbine blades 5 substantially directly connected without a gear via a rotor shaft 21 to the rotating rotor 9 of a multi pole generator 10 comprising permanent magnets, the stator 16 connected to a generator side AC/DC converter 11 for converting generated AC to a DC-link 12, a grid side DC/AC converter 13 and a transformer 14 for transformation to required grid voltage of the utility grid 15.

A converter control system 23 is connected to said converters 11, 13 in order to control their performance.

In various embodiments the invention relates to gear-less wind turbines operating synchronous with generator speed in the range of e.g. 5 to 25 rpm.

In other embodiments the invention relates to wind turbines with one or more gear stages operating synchronous with generator speed in the range of e.g. 15 to 3000 rpm.

For different embodiments said multi pole generator 10 can be of at least 3 different principal generator types i.e. an axial-flux generator 18, radial-flux generator 17 and transverse-flux generator. The basic difference between said generator types is the way the generated magnetic flux in the stator coils 19 are oriented relative to the rotor axis or rotor shaft 21 of the wind turbine.

FIG. 3*a* and FIG. 3*b* illustrates schematically the principle construction of an axial-flux 18 and a radial-flux 17 generator respectively. Both types of generators comprise stator coils 19 and permanent magnets 20 connected to a rotating rotor shaft 21. Arrows 22 indicates the direction of the magnet flux.

One embodiment of a multipole generator is illustrated in *fig.* 4*a* comprising permanent magnets 20 connected to a rotor shaft 21 rotating between two rows of stator coils 19 with iron yoke 24.

Figure 4A:
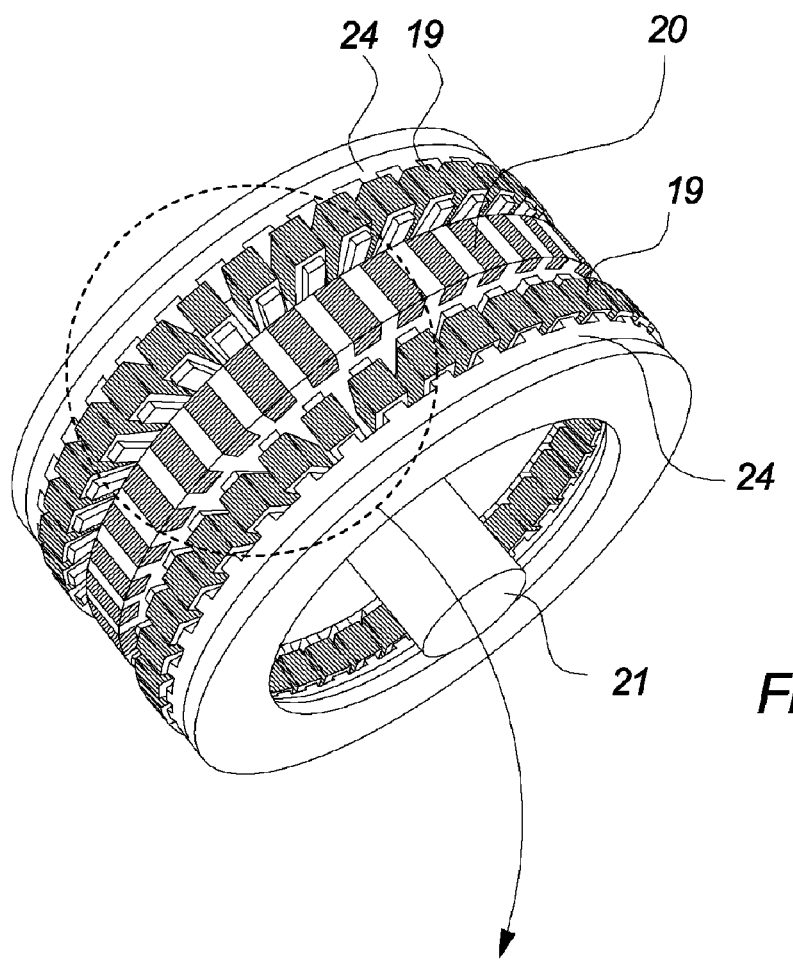
FIG. 4a illustrates an axial-flux generator.
Figure 4B:
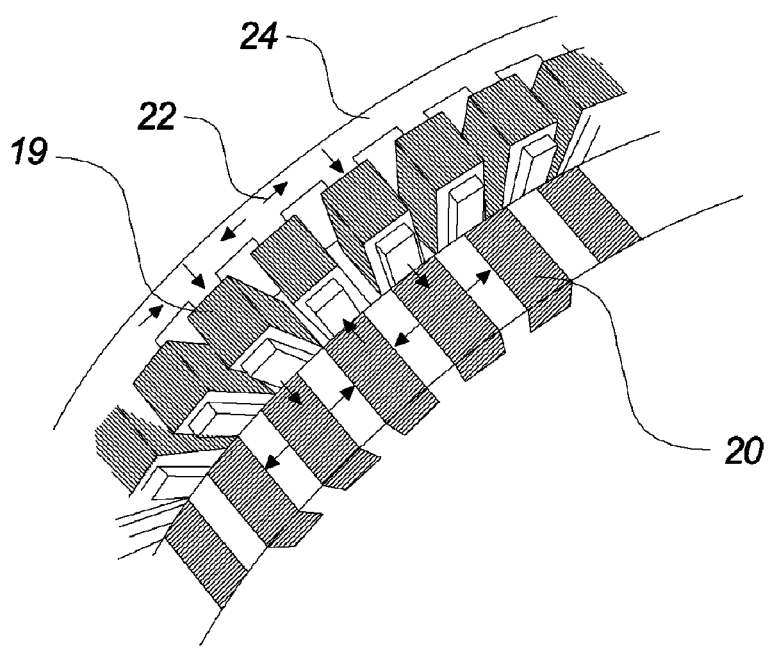
FIG. 4b illustrates a momentary flow of magnetic flux in an axial-flux generator.

FIG. 4*b* illustrates in an explored view, a momentary flow of magnetic flux in this embodiment. Arrows 22 indicates the directions.

For different embodiments of the invention, a generator can comprise more than one generator sections, each section principle constructed e.g. as FIG. 3*a* and/or FIG. 3*b* i.e. with a rotor comprising PM material and a number of stator sections.

The installation of said permanent magnets 20, or PM material, in the rotor 9 of a wind turbine can be done in a substantially non-magnetized condition or in partly or fully magnetized condition.

If magnetization of the permanent magnets 20 is done after they are installed in the rotor 9, the installation may require the use of special designed tools. For different embodiments of the invention the design of the generator 10 comprises design of special holding means for said PM material 20 on the rotor 9. The holding means must be designed as to ensure that the magnets 20 are retained in a desired and correct position during operation and during magnetization. For various embodiments of the invention the design can comprise special shaped PM materials 20 as well as special shaped retainers 26 and/or holding means.

Figure 5:
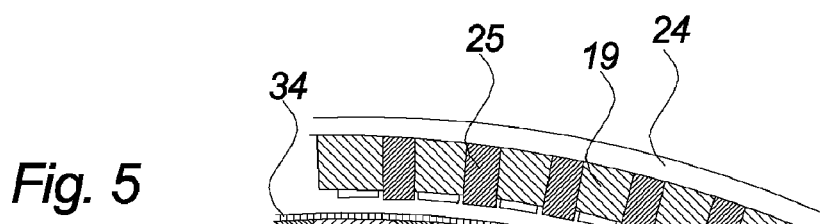
FIG. 5 illustrates schematically a cross-section of the invention.

FIG. 5 illustrates parts of a side cross-view of a generator 9 according to one embodiment of the invention, comprising stator coils 19 with iron yoke material 24, stator isolators 25 between stator coils 19, rotor permanent magnets 20 and magnet retainers 26 for fastening said magnets to the rotor base 27. For this embodiment the shapes of permanent magnets 20 and the retainers 26 are adapted as to fit each other, in order to ensure an optimal fastening to the rotor base 27.

For various embodiments of the present invention, the retainers 26 can be fixed parts of the rotor base 27, separate parts but fixed mounted on the rotor base 27 or separate parts detachable from the rotor base 27. Furthermore for embodiments of the present invention, said rotor permanent magnets 20 are held in position by holding means such as adhesive, screws, bolts, clamps, clips or the like and can be mounted in said holding means before or after the rotor 9 is mounted in the generator.

For other embodiments of the invention said magnets are covered by a holding layer 34 for fastening said magnets to the rotor base 27. Said holding layer 34 can be of magnetic or non-magnetic material.

For even further embodiments of the invention the stator coils 19 can be super conducting coils.

Magnetizing the PM materials 20 comprises placing the material in an external magnetic field e.g. produced by a solenoid with a direct current passing through it. When the field is removed, the PM material 20 retains some of the magnetism with a magnetic pole orientation defined by the applied magnetic field.

For embodiments of the invention said solenoid can be one or more magnetization coils designed for magnetization operation.

For one embodiment of the invention where the rotor 9 is mounted in the generator and permanent magnets 20 are installed in the holding means of the rotor 9, magnetization of the magnets 20 can be done by stator coils 19.

Figure 6A:
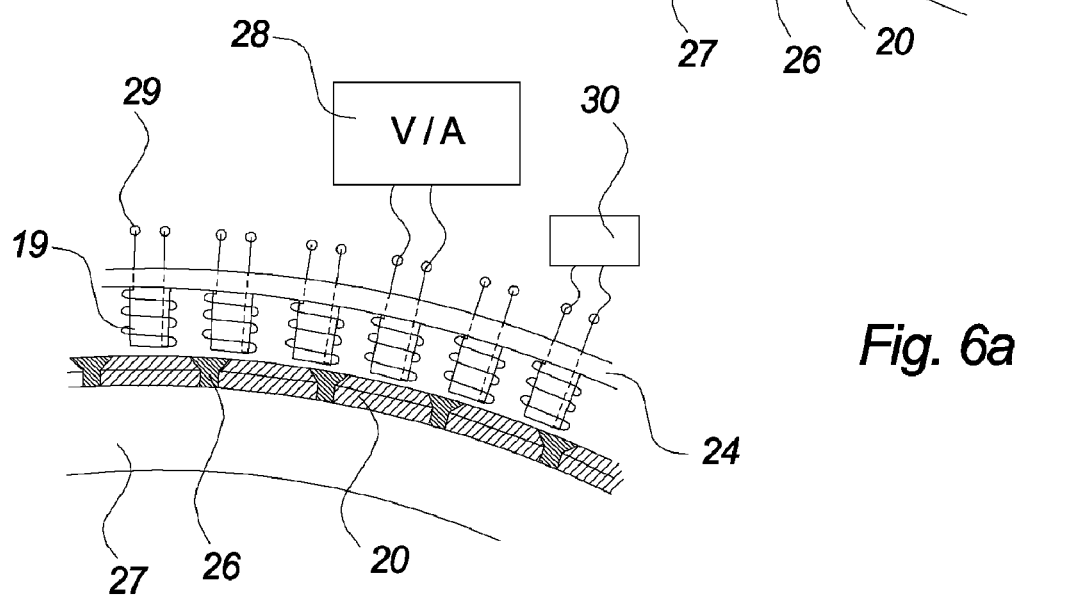
FIG. 6a illustrates schematically stator coils of a cross-section of the invention.

FIG. 6*a* illustrates schematically the functional concept of magnetizing a rotor for one embodiment of the invention, comprising magnetizing coils 31, rotor permanent magnets 20 and magnet retainers 26 for fastening said magnets to the rotor base 27. For this embodiment of the invention, the shape of permanent magnets 20 and their retainers 26 are adapted as to fit each other, in order to ensure an optimal fastening to the rotor base 27.

A magnetization controller 28 is used during the magnetization process in order to control one or more parameters vital for the process such as voltage (V), current (A), time, temperature, position of rotor 9, level of magnetization etc.

As illustrated in FIG. 6*a* the magnetization controller 28 is electrically connected to terminals 29 of one or more magnetizing coils 31.

During the magnetization procedure terminals 29 of coils not connected to said magnetization controller 28 can be connected to a proper termination 30 or can be left non-terminated.

For different embodiments of the invention, the one or more magnetization coils 31 used for magnetization are the stator coils 19 also used during normal operation or special purpose magnetization coils 31 used only during magnetization.

Furthermore said special purpose magnetization coils 31 can be part of the stator construction during normal operation or can be temporary mounted in close proximity to the PM material 20 during the magnetization procedure only e.g. by replacing one or more sections of normal operation stator coils 19 by one or more sections of special purpose magnetization coils 31.

For one embodiment of the invention during a magnetization procedure, the position of the rotor 9 is controlled in such a way that it is rotated in order to place the rotor permanent magnets 20 intended to be magnetized on a desired position relative to the said magnetization coils 31.

For another embodiment of the invention during a magnetization procedure, the rotor 9 is kept at a fixed position and the positioning of said magnetization coils 31 are altered as to be positioned on a desired position relative to the rotor permanent magnets 20 intended to be magnetized.

For yet another embodiment both the rotor 9 and the magnetization coils 31 are altered during a magnetization procedure.

For all embodiments the generator comprising rotor—and stator construction and supporting structures is designed as to handle the excessive mechanical forces produced during magnetization and during operation.

Figure 6B:
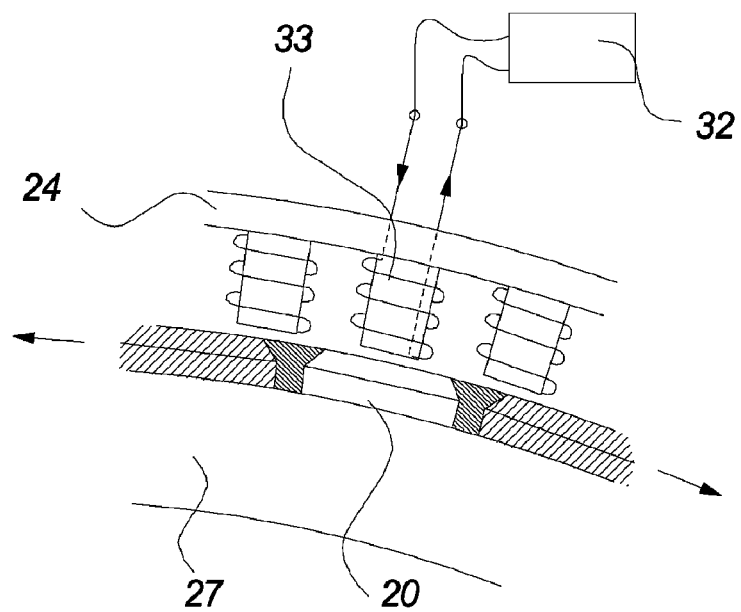
FIG. 6b illustrates schematically magnetization sensors at a cross-section of the invention.

FIG. 6*b* illustrates schematically the functional concept of sensing the magnetization of rotor permanent magnets for various embodiments of the invention. When the permanent magnet 20 passes a magnetization sensor 33, here depicted as a stator coil, a current is induced in its windings as indicated by arrows. The sensed current is fed to measuring means 32 for post processing.

For various embodiments said measuring means 32 comprises memory means for storing post processed values of said sensed current. Said memory means can be non-volatile as to ensure that values remains available even under and/or after a power down and/or after a power up of said measuring means.

For different embodiments of the invention, the one or more magnetization sensors 33 are the stator coils 19 also used during normal operation or special purpose sensors used only for sensing magnetization.

Furthermore said special purpose magnetization sensors 33 can be part of the stator construction during normal operation or can be temporary mounted in close proximity to the PM material 20 during the sensing e.g. by replacing one or more sections of normal operation stator coils 19 by one or more sections of special purpose magnetization sensors 33.

For one embodiment of the invention said sensing magnetization sensors are one or more Hall-effect sensors.

For one embodiment of the invention said measured values are established during or substantially immediately after a magnetization procedure, which can be an initial procedure following installation of non-magnetized PM material, or can be a re-magnetization of said PM material.

For another embodiment of the invention said measured values are established during a magnetization procedure by measuring the magnetizing current supplied to magnetizing coils 31 which, for further embodiments of the invention, may comprise one or more magnetization sensors 33.

For further embodiments of the invention said measured values are obtained after termination of said magnetization procedure. The measured values established represents one set of reference values or an initial fingerprint that can be used subsequently e.g. for further data-processing or control.

For other embodiments of the invention said measured values are established from generators comprising PM material that is magnetized prior to installation in the generator.

When said measured reference values—or fingerprint—are established, the rotational position of the rotor can, for various embodiments of the invention, be registered as to be able to identify the specific measured values from specific rotor permanent magnets.

For various embodiments of the invention said measured values are established during normal operation of the wind turbine as to set a measure for the operation of the wind turbine.

If a first set of measured values or fingerprint is established and stored it is e.g. possible to compare a second obtained set of data or a new fingerprint to the first by e.g. said measuring means 32 or other means and where upon parameters of the wind turbine can be monitored and controlled.

Furthermore by continuous measurements, by sample measurements obtained with suitable time intervals and/or by measurements established on demand it is possible to track values for quality control of parameters of the generator over time such as de-generation of the magnetic fields of the rotor permanent magnets and to make statistics, trends etc.

Said measurements furthermore make it possible to monitor status of operation during normal operation such as locating defect magnets and monitor the performance of the generator. Even further said measurements can be used as control parameters for the power converter controller.

Even further said measurements can be used in prediction of the performance of the generator and/or permanent magnets, and can reveal parameters of operation such as optimal time for service, estimated time to required service etc.

For one embodiment of the invention the measurements can be used in planning if and when rotor permanent magnets must be replaced or re-magnetized or the magnetization level must be adjusted.

For various embodiments in case of re-magnetization or adjustment of magnetization level, this can be carried out during a service session or during normal operation.

For one embodiment of the invention the magnetization current needed by magnetization coils 31 for the magnetization is supplied by at least one power converter 11, 13 or section or combined sections of said power converter.

For another embodiment of the invention the magnetization current needed by magnetization coils 31 for the magnetization is supplied by one or more power converters dedicated to said magnetization.

For various embodiments of the invention said power converters supplying current to the magnetization coils 31 can be either power converters 11, 13 of the wind turbine or converters common to more than one wind turbine such as transportable power converters dedicated magnetization purposes.

What is claimed is:

1. A method for estimating a magnetization level of one or more permanent magnets established in one or more permanent magnet rotors of a wind turbine generator comprising the steps of:
    establishing one or more magnetization sensors at the stator of the generator,
    connecting said one or more magnetization sensors to measuring means,
    processing measured data in said measuring means, and establishing values of magnetization.

2. The method according to claim 1, wherein said establishing one or more magnetization sensors is performed when the wind turbine generator is installed in a wind turbine nacelle.

3. The method according to claim 1, wherein said establishing one or more magnetization sensors is performed before or after mounting the nacelle on a wind turbine tower.

4. The method according to claim 1, wherein said connecting one or more magnetization sensors comprises connecting at least one stator coil of the generator.

5. The method according to claim 4, wherein said one or more magnetization sensors are replacing one or more stator parts of the wind turbine generator.

6. The method according to claim 1, wherein said values of magnetization are established substantially continuously or at predefined intervals during normal operation.

7. The method according to claim 6, wherein said values of magnetization are established after termination of a magnetization procedure.

8. The method according to claim 6, wherein said values of magnetization are established by measuring a magnetizing current supplied to said magnetizing coils.

9. The method according to claim 8, wherein said magnetizing coil further comprises one or more magnetization sensors.

10. The method according to claim 1, further comprising the step of evaluating said established values of magnetization by evaluating means.

11. The method according to claim 10, wherein said evaluating comprises comparing recent established values with previous stored established values.

12. The method according to claim 10, wherein said evaluating comprises at least one of calculating trends of established values and predicting future values.

13. The method according to claim 10, further comprising the step of controlling parameters of the wind turbine on the basis of said evaluation of established values.

14. A wind turbine comprising:
    a wind turbine tower,
    a wind turbine rotor,
    a wind turbine nacelle comprising one or more wind turbine generators comprising one or more permanent magnets established in one or more permanent magnet rotors, and means for estimating a magnetization level of said one or more permanent magnets.

15. The wind turbine according to claim 14, wherein said wind turbine generator is an axial-flux generator, a radial-flux generator or a transversal-flux generator.

16. The wind turbine according to claim 14, wherein said means for estimating comprises at least one of the following: one or more magnetization sensors, one or more measuring means and one or more evaluating means.

17. The wind turbine according to claim 16, wherein said magnetization sensor is a stator coil of the generator or an established sensing coil dedicated for sensing magnetization.

18. The wind turbine according to claim 14, wherein said permanent magnets have been magnetized after they have been mounted in said permanent magnet rotors.

19. The wind turbine according to claim 14, wherein values of magnetization level are established by said means for estimating after termination of a magnetization procedure.

20. The wind turbine according to claim 14, wherein said means for estimating is one or more of the stator coils.

21. The wind turbine according to claim 14, further comprising a gear with one or more stages.

* * * * *